United States Patent
Hapke

(10) Patent No.: US 6,789,221 B2
(45) Date of Patent: Sep. 7, 2004

(54) INTEGRATED CIRCUIT WITH SELF-TEST CIRCUIT

(75) Inventor: Friedrich Hapke, Winsen/Luhe (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 367 days.

(21) Appl. No.: 09/922,140

(22) Filed: Aug. 3, 2001

(65) Prior Publication Data

US 2002/0069387 A1 Jun. 6, 2002

(30) Foreign Application Priority Data

Aug. 5, 2000 (DE) .......................................... 100 38 327

(51) Int. Cl.$^7$ ............................................... G01R 31/28
(52) U.S. Cl. ...................................... 714/733; 714/734
(58) Field of Search ................................ 714/733, 734, 714/724, 720, 30, 728, 732, 738

(56) References Cited

U.S. PATENT DOCUMENTS

| | | | | |
|---|---|---|---|---|
| 4,503,537 A | * | 3/1985 | McAnney | |
| 5,043,986 A | * | 8/1991 | Agrawal et al. | |
| 5,349,587 A | | 9/1994 | Nadeau-Dostie et al. | .. 371/22.3 |
| 6,219,811 B1 | * | 4/2001 | Gruetzner et al. | .......... 714/726 |
| 6,374,370 B1 | * | 4/2002 | Bockhaus et al. | ............ 714/39 |
| 6,442,722 B1 | * | 8/2002 | Nadeau-Dostie et al. | ... 714/731 |
| 6,625,688 B1 | * | 9/2003 | Fruehling et al. | ........... 711/109 |

FOREIGN PATENT DOCUMENTS

| | | | | |
|---|---|---|---|---|
| EP | 0780767 A2 | 6/1997 | ......... | G06F/11/267 |
| WO | 000800332 | 11/1997 | | |

* cited by examiner

Primary Examiner—Phung M. Chung
(74) Attorney, Agent, or Firm—Michael J. Ure

(57) ABSTRACT

In an integrated circuit comprising an application circuit (1) to be tested and a self-test circuit (5-16) which is provided for testing the application circuit (1) and comprises an arrangement (5-9) for generating deterministic test samples which are applied to the application circuit (1) for test purposes, the output signals occurring due to the application circuit (1) in dependence upon the test samples being evaluated by means of a signature register (13), an unlimited ON-chip testing possibility of the integrated circuit without additional circuit elements in the application circuit (1) is ensured for test purposes in that the self-test circuit (5-16) comprises a masking logic element (14) which, during testing, blocks those bits of the output signals of the application circuit (1) which, based on the circuit structure of the application circuit (1), have undefined states and applies only the other bits to the signature register (13).

5 Claims, 1 Drawing Sheet

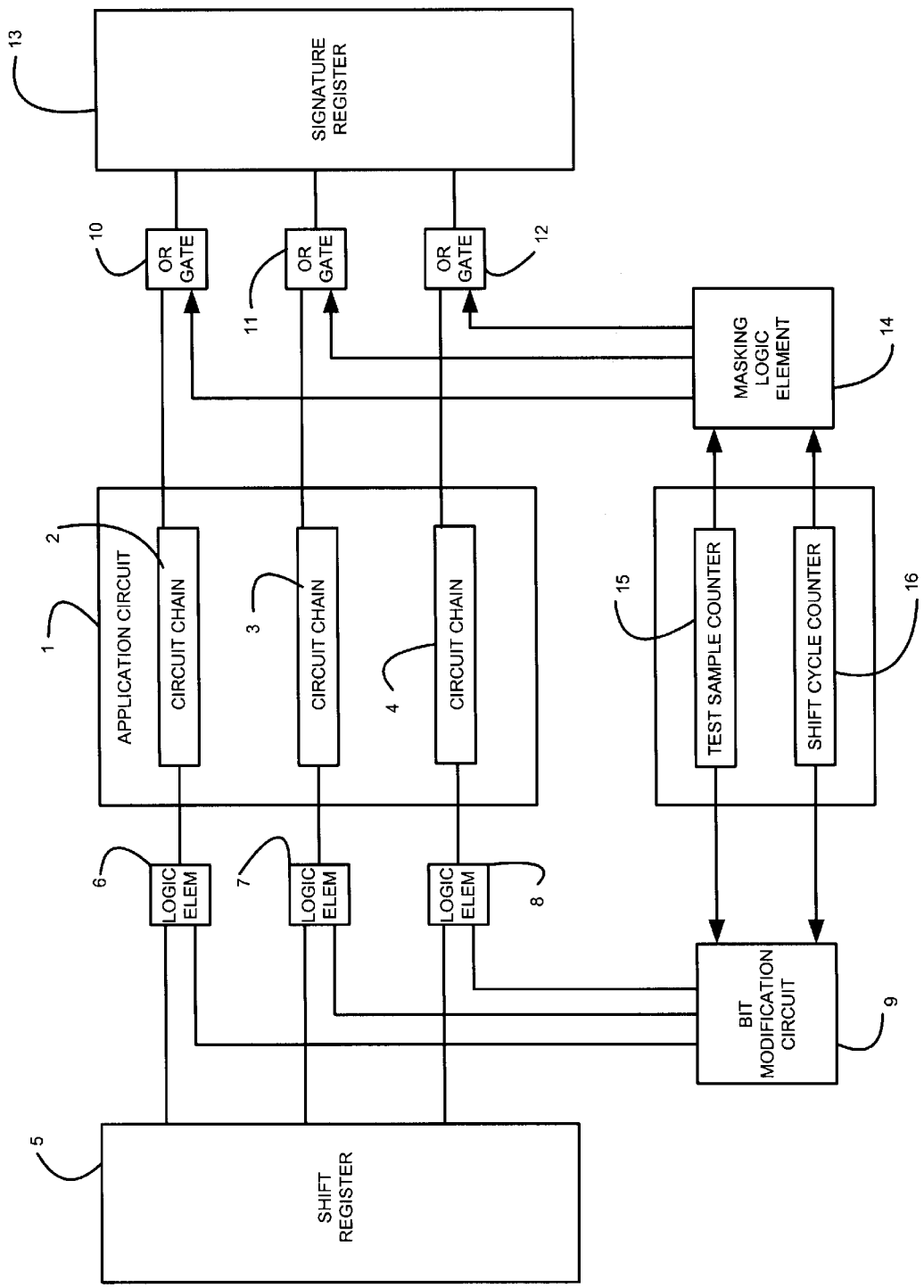

INTEGRATED CIRCUIT WITH SELF-TEST CIRCUIT

FIELD OF THE INVENTION

The invention relates to an integrated circuit comprising an application circuit to be tested and a self-test circuit which is provided for testing the application circuit and comprises an arrangement for generating deterministic test samples which are applied to the application circuit for test purposes, the output signals occurring due to the application circuit in dependence upon the test samples being evaluated by means of a signature register.

BACKGROUND OF THE INVENTION

When manufacturing integrated circuits, there is the general wish to test their operation. Such tests may be performed by external test arrangements. Due to the very high integration density of such circuits, the very high clock rates at which these circuits operate and the required very large number of test vectors, the external tests involve many problems and costs. The high internal clock rates of the integrated circuits are in an unfavorable proportion to the comparably very slow input/output bond pad stages that lead to the exterior. It is therefore desirable to have the possibility of performing a kind of self-test of the integrated circuit. To this end, a self-test circuit is incorporated in the integrated circuit and is used to test the application circuit which is also provided in the integrated circuit. The application circuit represents that circuit which is provided for the actual purpose of use of the integrated circuit.

When such circuits are tested, problems with those components within the circuit occur which produce a so-called "X" during testing, i.e. a signal which cannot be evaluated unambiguously. Such signals are particularly produced by those components that have an analog or a memory behavior. For example, RAMs incorporated in the application circuit may produce arbitrary output signals. Signals produced by such a RAM and propagated by the circuit at its output can no longer be evaluated unambiguously during testing.

To avoid this problem, it is known from the prior art to incorporate special components in the circuit which, during testing, bypass such components or mask the outputs of these components. This has the drawback that additional components must be incorporated in the circuit which, on the one hand, leads to a higher number of components and, on the other hand, results in a special structure of the circuit with the possible attendant drawbacks.

An integrated circuit with an application circuit to be tested and a self-test circuit providing deterministic test samples is known from the publication "Using BIST control for pattern generation" by Gundolf Kiefer and Hans-Joachim Wunderlich (published in Proceedings International Test Conference 1997). This is achieved in that, in addition to a test sample generator, which is a feedback shift register and supplies pseudo-random samples, a logic element is provided which changes the output signal of this test sample generator in such a way that given deterministic test samples are produced. It can thereby be achieved that the circuit can be tested with predeterminable test samples and not only with samples that are quasi accidentally predetermined by the test sample generator.

SUMMARY OF THE INVENTION

It is an object of the invention to improve the integrated circuit described in the opening paragraph in such a way that a test of the application circuit with deterministic test samples is possible and that X signals simultaneously occurring within the circuit do not disturb the test results during testing, while no additional components need to be incorporated in the application circuit.

According to the invention, this object is solved in that the self-test circuit comprises a masking logic element which, during testing, blocks those bits of the output signals of the application circuit which, based on the circuit structure of the application circuit, have undefined states and applies only the other bits to the signature register.

The test samples generated by the self-test circuit are deterministic, i.e. they are predetermined test samples. These test samples are applied to the application circuit which changes the test samples in dependence upon the structure of the application circuit. The output signals of the application circuit thereby produced during testing are coupled to the signature register. The signature register combines these output signals, which originate from a plurality of test cycles, to one final result which represents a kind of signature and indicates whether the circuit operates without disturbances.

In this method, however, problems occur when components which are almost always present in the application circuit and have an analog or a memory behavior influence the output signals of the application circuit during testing. Then, so-called X signals are produced which supply a "don't care result". In other words, such X-marked signals cannot be evaluated. Similarly, values which cannot be evaluated are produced for such signals in the signature register. This should be avoided.

According to the invention, this is achieved in that a masking logic element is provided. During testing of the circuit, the masking logic element blocks all those bits in the output signals of the application circuit which potentially comprise such X signals, i.e. all those bits which are influenced by a memorizing or analog behavior of components within the application circuit. The masking logic element only passes the other bits which are not influenced by such components to the signature register.

It is thereby ensured that those bits reaching the signature register during testing can be evaluated throughout. This in turn means that the signature result obtained in the signature register after passing through a plurality of test cycles can be completely evaluated and yields a reliable test result.

An essential advantage of the integrated circuit with a self-test circuit according to the invention is that the application circuit does not need to be modified for the test processes, i.e. it may be built up in such a way that it is optimal for use of the application circuit. The self-test circuit does not influence the normal operation of the application circuit in any way.

Furthermore, the self-test circuit according to the invention allows testing of the application circuit on the chip so that relatively slow bond pad connections do not disturb the test and the application circuit can be operated at maximum clock rates.

In accordance with an embodiment of the invention as defined in claim 2, the test sample counter may be advantageously used for supplying a signal to the masking logic element informing this logic element which test sample within a plurality of test cycles is in the process of passing through the application circuit so that the masking logic element can accordingly block the bits in the output signal of the application circuit that are influenced during this passage by storing or analog components.

A shift cycle counter provided in accordance with a further embodiment of the invention as defined in claim 3 signalizes the state of shift registers in the application circuit to the masking logic element. It is thereby known which bits of the shift register should be blocked by the masking logic element and which should not be blocked.

These and other aspects of the invention are apparent from and will be elucidated with reference to the embodiments described hereinafter.

BRIEF DESCRIPTION OF THE DRAWING

In the drawing:

The sole FIGURE shows an embodiment of the invention.

The FIGURE is a block diagram of an integrated circuit comprising an application circuit 1. This application circuit is the circuit conceived for use of the integrated circuit.

DETAILED DESCRIPTION OF THE DRAWING

It is desirable to test the flawless operation of the application circuit 1 after manufacture of the integrated circuit. To this end, a self-test circuit comprising the circuit elements 5 to 16 as shown in the FIGURE is provided on the integrated circuit.

In the integrated circuit according to the invention, this self-test circuit is formed in such a way that it is built completely outside the application circuit 1 and thus does not influence its behavior during normal operation.

In the embodiment shown in the FIGURE, it is assumed that the application circuit 1 has three circuit chains 2, 3 and 4 which are shift registers. There may also be more shift registers.

The self-test circuit incorporates a linear feedback shift register 5 supplying a pseudo-random sequence of test samples. Since the shift register 5 is fed back and has only a finite length, this test sample sequence is not really a random sequence but has a repetitive sample within given distances. However, this test sample sequence has the drawback that it does not specifically comprise those test samples that are optimal for testing the application circuit 1.

To this end, a bit modification circuit 9 is provided which changes the output signals of the linear feedback shift register 5 via combination logic elements 6, 7 and 8 in such a way that test samples having a predeterminable and deterministic structure are obtained at the outputs of the combination logic elements 6, 7 and 8 and hence at the inputs of the application circuit 1 and their circuit chains 2, 3 and 4. This is achieved in that the bit modification circuit 9 modifies individual bits of the test samples supplied by the linear feedback shift register 5 by means of the combination logic elements 6, 7 and 8 in such a way that desired, deterministic test samples are obtained.

In the embodiment shown in the FIGURE, these are applied to the circuit chains 2, 3 and 4 within the application circuit 1.

Based on these test samples, the circuit chains 2, 3 and 4 within the application circuit 1 supply output signals which are applied to a signature register 13 via OR gates 10, 11 and 12.

The signature register 13 is formed in such a way that it combines the test results from a plurality of test cycles each comprising a test sample, and supplies a so-called signature after the test, which signature must have a given predetermined value when the application circuit 1 is operated without disturbances.

However, in this case there is the problem that circuit elements having an analog or a memory behavior may be (and are often actually) present within the application circuit 1 or within its circuit chains 2, 3 and/or 4. Such circuit elements do not supply an unambiguous output signal, i.e. in dependence upon the input signal applied to them, they do not supply a deterministic output signal. Their output signal is rather accidental. It will be evident that such signals do not only disturb the test result but render certain bits within the test result unusable.

To be able to nevertheless test the application circuit 1 with such components by means of a possibly simple structure, the circuit according to the invention comprises a masking logic element 14 which supplies control signals to the OR gates 10, 11 and 12. By means of these signals, the masking logic element 14 controls the OR gates 10, 11 and 12 in such a way that, during testing, only those bits reach the signature register 13 that are not influenced by components having a memorizing or analog behavior.

Consequently, only those bits reach the signature register 13 that can be evaluated unambiguously and yield an unambiguous result. Thus, also an unambiguous signature flawlessly indicating a test result can be generated at the end of the test in the signature register 13, even when the application circuit 1 comprises components with a memorizing or analog behavior.

To inform the masking logic element 14 of the extent of progress in the testing process, a test sample counter 15 is provided which supplies a corresponding signal to the masking logic element 14 and the bit modification circuit 9.

The masking logic element 14 is programmed or circuit-technically formed in such a way that it knows by way of the number of the current test sample supplied by the test sample counter which bits in the output signals of the circuit chains 2, 3 and 4 of the application circuit 1 can be evaluated and passed on to the signature register 13, and which bits are to be blocked by means of the OR gates 10, 11 and 12.

Furthermore, a shift cycle counter 16 is provided, whose output signal is also applied to the bit modification circuit 9 and the masking logic element 14.

The shift cycle counter 16 supplies a signal indicating the state of the shift registers 2, 3 and 4 to the masking logic element 14. The state of the counter 16 informs the masking logic element which positions of the shift registers 2, 3 and 4 are to be masked.

The self-test circuit according to the invention provides the possibility of testing the application circuit 1 on the chip without any limitation. No modification of the application circuit 1 is required so that it can be constructed optimally for its actual use. A test at full clock rates is also possible because the slow, external bond connections do not need to be used during testing. All test processes are also possible in an unlimited way for those application circuits which comprise components having a memorizing or analog behaviour.

What is claimed is:

1. An integrated circuit comprising an application circuit (1) to be tested and a self-test circuit (5-16) which is provided for testing the application circuit (1) and comprises an arrangement (5-9) for generating deterministic test samples which are applied to the application circuit (1) for test purposes, the output signals occurring due to the application circuit (1) in dependence upon the test samples being evaluated by means of a signature register (13), characterized in that the self-test circuit (5-16) comprises a masking logic element (14) which, during testing, blocks those bits of the output signals of the application circuit (1) which, based on the circuit structure of the application circuit (1), have undefined states and applies only the other bits to the signature register (13).

2. An integrated circuit as claimed in claim 1, characterized in that a test sample counter (15) is assigned to the masking logic element (14) receiving a signal from the test sample counter (15), which signal continuously transmits, in a test, an identification number of the active test sample to said masking logic element (14).

3. An integrated circuit as claimed in claim 1, characterized in that the masking logic element (14) comprises a shift cycle counter (16) supplying a signal to the masking logic element (14) indicating the shift state of shift registers (2, 3, 4) in the application circuit (1).

4. An integrated circuit as claimed in claim 1, characterized in that the self-test circuit (5-16) comprises a linear, feedback shift register (5) which generates pseudo-random test samples which are converted into predeterminable, deterministic test samples by means of a bit modification circuit (9).

5. An integrated circuit as claimed in claim 1, characterized in that the masking logic element (14) blocks those bits of the output signals of the application circuit (1) which are influenced by those circuit elements of the application circuit (1) that have an analog behavior and/or a memory behavior.

* * * * *